United States Patent
Kurshan et al.

(10) Patent No.: US 6,311,293 B1
(45) Date of Patent: Oct. 30, 2001

(54) DETECTING OF MODEL ERRORS THROUGH SIMPLIFICATION OF MODEL VIA STATE REACHABILITY ANALYSIS

(75) Inventors: Robert Paul Kurshan, New York, NY (US); Carlos Manuel Roman, Bethlehem, PA (US)

(73) Assignee: Lucent Technologies Inc., Murray Hill, NJ (US)

(*) Notice: Subject to any disclaimer, the term of this patent is extended or adjusted under 35 U.S.C. 154(b) by 0 days.

(21) Appl. No.: 09/211,582

(22) Filed: Dec. 14, 1998

(51) Int. Cl.[7] .................................................. H02H 3/05
(52) U.S. Cl. ................................. 714/37; 716/5; 703/13
(58) Field of Search ................................. 714/37; 703/2, 703/13; 700/83; 716/5; 713/176

(56) References Cited

U.S. PATENT DOCUMENTS

| | | | |
|---|---|---|---|
| 5,465,216 | * 11/1995 | Rotem et al. | 364/488 |
| 5,513,122 | * 4/1996 | Cheng et al. | 364/489 |
| 5,691,925 | * 11/1997 | Hardin et al. | 364/578 |
| 6,099,575 | * 8/2000 | Hardin et al. | 703/22 |
| 6,102,959 | * 8/2000 | Hardin et al. | 703/2 |

* cited by examiner

*Primary Examiner*—Robert Beausoleil
*Assistant Examiner*—Rita Ziemer
(74) *Attorney, Agent, or Firm*—Henry T. Brendzel

(57) ABSTRACT

Efficient formal verification of a system model is obtained by performing a state reachability analysis of an unrestricted full system model that includes constraints selected by the tester for testing a given property, followed by an analysis that permits a reduction in the complexity of the tested system's model. The analysis involves determining variables of the system's model that do not change value in the course of the state reachability analysis, often because of the constraints imposed prior to performing the reachability analysis. The unchanging variables are replaced with constants, and those constants are propagated through the system model to simplify the state transition relations that define the system. The simplified system model is then applied to a verification tool to determine whether the liveness property is satisfied.

7 Claims, 1 Drawing Sheet

DETECTING OF MODEL ERRORS THROUGH SIMPLIFICATION OF MODEL VIA STATE REACHABILITY ANALYSIS

FIELD OF THE INVENTION

The present invention relates to system verification, and more particularly to a method and apparatus for checking the behavior of finite state system models.

BACKGROUND OF THE INVENTION

An ongoing problem in the design of large systems is verifying that the system will behave in the manner intended by its designers. One approach has been to simply build and test the system itself. Of course, building a system can be an expensive proposition and, therefore, artisans have migrated toward building and testing a model of the system through software.

In a software environment, a system model is typically embodied in a block of code that, when executed, simulates the intended functions and/or features (properties) of the system. More specifically, the system model accepts inputs, performs functions and (generates outputs in the same manner as would the actual system. By controlling the value of the system model inputs and monitoring the system model outputs, the functionality, or properties, of the system can be thus tested.

One method of testing a system model is called formal verification. In formal verification, the system model is fed into a verification tool that converts the system model into a finite state machine. The finite state machine is a set of states and state transitions that mimic the operation of the system model in response to any given set of system model inputs. More specifically, each state represents a state of the system, and each state transition indicates the conditions (i.e., the values of external inputs and system variables) that must be met for the system to transition from one state to another state.

Once a system model is converted to a state machine, the verification tests whether the system model behaves according to a set of expected behaviors. To do this, the verification tool varies the system model inputs and monitors which states the system model enters as a result of the inputs. This has been referred to as searching the state space of the system model. While searching the system model state space, the verification tool can check whether the system model enters a state or a cycle of states which the designers of the system define as "bad" or unintended. If the system model enters a "bad" state or a "bad" cycle of states, the system model is said to behave in a manner contradictory to that intended by the system designer, thus requiring a redesign.

Viewed more formally, it is said that a system has two classes of properties: safety and liveness. A safety property violation is a violation that can be detected in the course of performing the reachability analysis, because it relates to conditions that may be falsified at a given state. For example, given a condition such as x is always equal to y defines a safety property whose correctness can be checked in the course of determining the reachable states. A liveness property is one which can be falsified at some state in the course of a reachability analysis. An example of such a property is "if request x, eventually grant y". A proof of a failure of a liveness property may take an infinite sequence because, as can be readily observed from the above example, in any finite number of steps (that don't end up in a cycle) the next step might satisfy the property (y would be granted).

Another way to describe a safety property is one where "nothing bad will happen". A liveness property is one where "something good will (eventually) happen".

Heretofore, to fully test every property of the system model through formal verification, the verification tool has had to run a full search of the system model's reachable states from a designated set of initial states. A full search of a system model state space is a test wherein, at each state, the system model inputs are varied, and non-deterministic choices for the next state are varied, such that they take on every value they can possibly assume in every possible order or sequence. As a result, a full search of reachable states insures that the system model behavior is tested under every set of conditions that the system model can possibly undergo when in operation.

One can easily realize as the number of system model inputs increases, and as the range of assumable values for each input increases, the greater is the number of states of the system, and the greater the amount of computational resources that are necessary to complete a full search. In fact, it has been found that fully searching a reasonably complex models with conventional verification tools can cause the verification tool to run out of computational resources, such as memory to store temporary data. When this happens, the verification tool may "lock-up" without providing the tester with data as to whether the system model had behaved as expected and hoped.

One solution to this problem is to reduce the size of the system model and run a full search of the reduced model. That is, a tester who is experienced in the details of the system model eliminates portions of the system that the tester believes have no effect on the tested set of system properties, and proceeds with the reduces system model, hoping that the assumptions made were not erroneous. This may require, however, substantial time, effort and experience on the part of the tester to insure that the system model is not reduced so much as to fail to retain those portions that are critical for evaluating the tested properties. In addition, although reducing the system model reduces the amount of computational resources required to check the system model, such a reduction prevents a full search from checking the behavior of all system model properties.

Another solution to the computational resource problem associated with fully testing complex models is to perform only a partial search of the system model. A partial search is a test that identifies the states that the system model can enter when given a partial set of input values that are applied in a limited number of possible sequences. That is, a partial search does not test the behavior of the system model in response to every possible input value and in every possible sequence, as described above for the full search. Rather, during a partial search, the behavior of the system model is tested in response to only a portion of the total number of possible inputs.

Of course, the ability to identify design errors through a partial search is limited by the ability of the tester to predetermine which set of inputs may cause the system model to enter a "bad" state or cycle of states, as described above. This suggests that in order for the partial search to identify system model errors, the tester must either have intimate knowledge of the system model design, or be lucky enough to input a set of inputs in a sequence that exposes a "bad" or unintended system model behavior. Thus, by undertaking to perform a partial search to test a complex system model, the tester is left with the difficult task of guessing, which set of input values should be included in the partial search, and in what sequence the values should be input. This makes the task of checking the behavior of all system properties, or functions, substantially more difficult. Thus, such a partial search may not be a practical solution for testing a system model in many applications.

In a copending application, Ser. No. 09/923,297, filed Sep. 4, 1997, now U.S. Pat. No. 5,946,481, issued Aug. 31, 1999, an improved approach is disclosed. In this application, the system model is restricted based on the behavior of the system model during a partial search. A partial search is conducted in a prescribed manner, such as in accordance with a selected random process and, once the process terminates, the values assumed by system model variables or system model inputs during the partial search are used to restrict the set of assumable values for that variable or input. The restricted set of assumable values defines the values that the particular input or variable can assume during system model verification. Thus, the system model is transformed into a restricted model. A full search of the restricted model ten follows, but such a search involves a much smaller state space of the original system model, and requires fewer computational resources than fill search would.

It should be noted that if no error is found during the full search of the restricted model, there is only partial assurance that the system model is error-free. The assurance is partial because only a partial search was performed on the original system model, and thus the behavior of the system model was tested in response to a limited set of inputs. Interestingly, if an error is identified during a full search of a restricted model, then there is again only partial assurance that the error is a true error. This is due to the fact that the step of restricting the model may result in some system model variables being restricted to a constant value. When this happens, a situation can easily arise wherein a now-constant variable is dependent on the value of a non-constant variable. This has the effect of breaking the dependency between the now-constant variable and any other variable that depends thereon as well as any other variable that may affect it. Therefore, there may be a set of inputs that, absent the restriction, would cause the now-constant system model variable to take on a different value. As a result, an error may be reported that would not occur in the unrestricted model. Such an error is said to be a false error because it is not due to an error in the original model, but rather is a result of an imperfect restriction of the original system model. To overcome this problem, additional steps must be taken to obtain full assurance that an error identified during a full search of a restricted system model is a true error. In one embodiment, the additional steps may include the step of verifying that the identified error exists in the original system model. In another embodiment, the additional steps may include the step of adjusting the restricted model, before the full search, to increase the probability that the restricted model will behave as would the original system model, when given a set of inputs.

SUMMARY OF THE INVENTION

A more comprehensive test is obtained by performing a state reachability analysis of an unrestricted full system model that includes constraints selected by the tester for testing a given property, followed by an analysis that permits a reduction in the complexity of the tested system's model. The analysis involves determining variables of the system's model that do not change value in the course of the state reachability analysis, often because of the constraints imposed prior to performing the reachability analysis. The unchanging variables are replaced with constants, and those constants are propagated through the system model to simplify the state transition relations that define the system. The simplified system model is then applied to a verification tool to determine whether the liveness property is satisfied.

DETAILED DESCRIPTION

Figure 1:
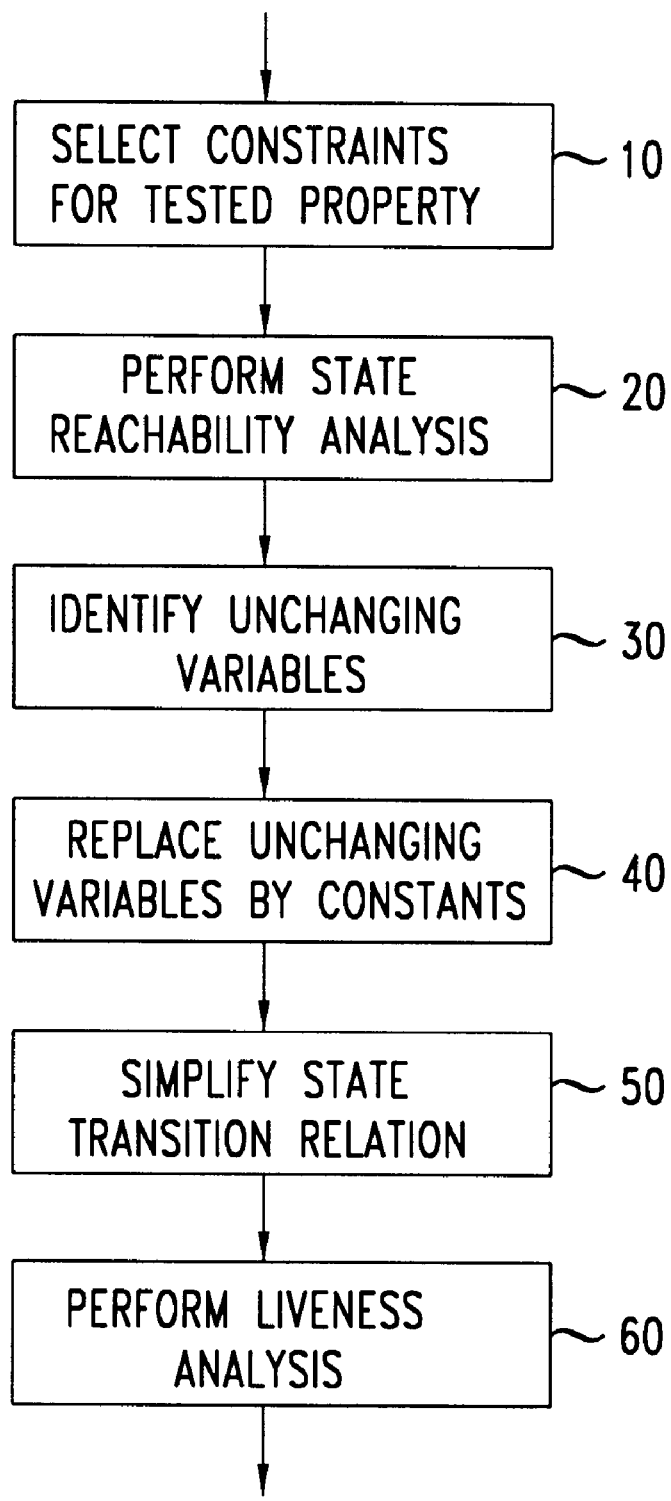
FIG. 1 presents a flow chart of the process in conformance with the principles of this invention.

When facing the question of whether a given or a proposed finite state system satisfies a given property, artisans often attempt to answer the posed question by performing an analysis of a model of the system in question. More specifically, artisans attempt to perform a formal verification to show that a finite state system that represents the system in question satisfies a given property. In some cases, the way to perform a formal verification is to compute all reachable states from a selected initial state (all of the states that are reachable within a finite number of steps) and then evaluate whether there are bad cycles among the reachable states. A bad cycle, if it exists, is a cycle that violates a liveness property.

Since checking safety properties is one known by-product of a reachability analysis, the main thrust of this disclosure is checking liveness properties.

An important theorem that is known and which is employed in checking the liveness property states that: there is a violation of the liveness properly if, and only if, there is a succession of states that ends in a cycle and that cycle violates the liveness property. Stated another way, if there is a violation of the liveness property, then there is another violation that ends up in a cycle that violates the liveness property. That is, if there is a sequence of transitions which never satisfies a requested eventuality, then there is also a sequence of transitions which end up in a cycle, where the eventuality is neither satisfied prior to entering the cycle, nor after entering the cycle. Consequently, if a search of reachable states reveals that there are no bad cycles, one can conclude that the liveness property is satisfied (for the system with the selected constraints that were employed to determine the reachable states).

FIG. 1 depicts the improved process of this invention. In block 10, a property to be verified is identified, and constraints are imposed on the model that make sense to the tester in the context of the tested property. Given a generator for the state space of the system model (i.e., a set of state transition relations) that, for each state, identifies the state or set of states that can be reached from the state, block 20 identifies all of the reachable states for the aforementioned constraints (in a finite number of steps). Once the reachable states are known, block 30 analyzes the variables in the state model and identifies those variables which did not change in value in the course of the state reachability analysis of block 20. Those variables that have not changed in value are not "dummy" or useless variables. It is just that for the particular set of constraints selected for the verification run, those variables turn out to be equivalent to constants.

In accordance with the principles of this invention, this fact is utilized to simplify the state transition relations and, consequently, reduce the complexity of the verified system model. Thus, in block 50 the state transition relations are simplified. For example, when a variable is found to be an unchanging constant, for example, x=3, then another relation which, for example, may state that y=10+3x also converts to a constant. Another relation that employs y is, in turn simplified, and so, the fact that particular variables are unchanging ripples a simplifying effect through the entirety of the state transition relations.

Following this simplification, block 60 performs a liveness analysis in a conventional manner; for example, by performing a bad cycle analysis.

It should be noted that the state reachability analysis of block 20 is a conventional, well-known, process. In addition to identifying the set of states that are reachable by the finite state system under consideration—given the initial constraints—it also performs an analysis to insure that the safety properties are satisfied.

In verifications of integrated circuit designs the appearance of 10,000 variables is not unusual, and our experience indicates that is not uncommon for perhaps 500 of those variables to be unchanging for a particular set of constraints that are imposed in the course of verifying a particular property. This typically greatly simplifies the bad cycle analysis. Of course, for another property, another set of assumptions and constraints are made, and. Similarly, a different result may ensue for the same property but with different constraints.

We claim:

1. A verification process comprising the steps of:
    performing a state reachability analysis on a given system model defined by a set of state transition relations, subject to a chosen set of input constraints;
    determining internal variables that do not change in the course of said reachability analysis;
    replacing said unchanging internal variables with constants;
    simplifying said set of state transition relations by propagating effects of said step of replacing said unchanging internal variables with constants to form a simplified set of state transition relations; and
    performing a bad-cycle analysis through use of said simplified set of state transition relations.

2. The method of claim 1 there said step of performing a state reachability analysis also checks that safety properties are met.

3. The method of claim 1 there said step of performing a state reachability analysis also checks that no violation of stated safety property occurs.

4. The method of claim 1 there said step of performing a bad-cycle analysis ascertains whether said system violated stated liveness property.

5. A method for verifying a system model expressed in the form of a collection of state transition relations comprising the steps of
    identifying a set of system constraints,
    performing a state reachability analysis on said system model, subject to said constraints;
    determining internal variables that do not change in the course of said reachability analysis;
    replacing said unchanging internal variables with constants;
    propagating the replacement of unchanging internal variables with constants throughout said set of state transition relations, to form a simplified set of state transition relations; and
    performing a bad-cycle analysis on said system model through use of said simplified set of state transition relations.

6. The method of claim 5 where said constraints are constraints on input signals applied to said system model.

7. In a method for verifying a system model expressed in the form of a collection of state transition relations, where a step of state reachability analysis is performed and where a step of ascertaining the presence of bad cycles in said system model is performed by using said state transition relations, the improvement comprising the steps, interposed between said step of state reachability analysis and said steps of ascertaining the presence of bad cycles, of
    determining internal variables that do not change in the course of said reachability analysis;
    replacing said unchanging internal variables with constants; and
    propagating the replacement of unchanging internal variables with constants throughout said set of state transition relations, to form a simplified set of state transition relations, to be used in said step of ascertaining the presence of bad cycles.

\* \* \* \* \*